(12) United States Patent
Tamura et al.

(10) Patent No.: US 6,309,990 B2
(45) Date of Patent: *Oct. 30, 2001

(54) GLASS FIBER OF LOW PERMITTIVITY

(75) Inventors: Shinichi Tamura; Masahiro Mori, both of Fukushima (JP)

(73) Assignees: Nitto Boseki Co., Ltd.; Nitto Glass Fiber Mfg. Co., Ltd, both of Fukushima-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/284,512

(22) PCT Filed: Oct. 8, 1997

(86) PCT No.: PCT/JP97/03609

§ 371 Date: Apr. 20, 1999

§ 102(e) Date: Apr. 20, 1999

(87) PCT Pub. No.: WO98/16482

PCT Pub. Date: Apr. 23, 1998

(30) Foreign Application Priority Data

Oct. 16, 1996  (JP) .................................................. H8-273617

(51) Int. Cl.[7] ......................... C03C 3/091; C03C 3/093; C03C 3/118; C03C 13/02
(52) U.S. Cl. .............................. 501/35; 501/38; 501/59; 501/66; 501/67; 501/68; 501/70; 501/71
(58) Field of Search ................................. 501/35, 38, 59, 501/66, 67, 68, 70, 71

(56) References Cited

U.S. PATENT DOCUMENTS

| | | | | |
|---|---|---|---|---|
| 3,881,945 | * | 5/1975 | Trojer et al. | 501/35 |
| 4,101,709 | * | 7/1978 | Whang et al. | 501/66 |
| 4,824,806 | * | 4/1989 | Yokoi et al. | 501/35 |
| 5,055,428 | * | 10/1991 | Porter et al. | 501/66 |
| 5,284,807 | * | 2/1994 | Komori et al. | 501/35 |
| 5,691,255 | * | 11/1997 | Jensen et al. | 501/36 |

FOREIGN PATENT DOCUMENTS

| | | | |
|---|---|---|---|
| 62-226839 | | 10/1987 | (JP) . |
| 64-51345 | | 2/1989 | (JP) . |
| 3-215329 | | 9/1991 | (JP) . |
| 6-211543 | | 8/1994 | (JP) . |
| 6-219780 | | 8/1994 | (JP) . |
| 7-10598 | | 1/1995 | (JP) . |
| 09-221338 | * | 8/1997 | (JP) . |
| 831 072 | * | 3/1998 | (JP) . |
| 63-225552 | | 9/1998 | (JP) . |
| 96/39363 | * | 12/1996 | (WO) . |

* cited by examiner

Primary Examiner—David R. Sample
(74) Attorney, Agent, or Firm—Nixon & Vanderhye

(57) ABSTRACT

A low-dielectric-constant glass fiber having a glass composition comprising, by % by weight, 45 to 60% of $SiO_2$, 8 to 20% of $Al_2O_3$, 15 to 30% of $B_2O_3$, 0 to 5% of MgO, 5%, exclusive of 5%, to 12% of CaO, 0 to 1.0% of $Li_2O+Na_2O+K_2O$, 0.5 to 5% of $TiO_2$ and 0 to 2% of $F_2$ is suitable for use for reinforcing a high-density printed wiring board required to have a low dielectric tangent and its peripheral members.

5 Claims, No Drawings

GLASS FIBER OF LOW PERMITTIVITY

TECHNICAL FIELD

The present invention relates to a low-dielectric-constant glass fiber, particularly to a low-dielectric-constant glass fiber having a low dielectric tangent suitable for use for reinforcing a printed wiring board required to have a low dielectric tangent and its peripheral plastic members.

TECHNICAL BACKGROUND

With the age of highly computerized societies in recent years, communication machines and equipment for satellite broadcasting, mobile phones, etc., tend to be digitized, and signal processing tends to be quicker. These use printed wiring boards constituted of composite materials composed of materials such as a reinforcing material, a resin, a modifier, a filler, and the like. Further, glass fibers are widely used as a reinforcing material for their peripheral plastic members. Conventionally, E glass is known as a commercially produced glass fiber of this kind.

When an alternate current is flowed in glass, generally, the glass absorbs energy with regard to the alternate current and absorbs it as heat. The dielectric loss energy to be absorbed is in proportion to a dielectric constant and a dielectric tangent which are determined by the components and the structure of the glass, and is shown by the following expression.

$$W = kfv^2 \times \in \tan \delta$$

in which W is a dielectric loss energy, k is a constant, f is a frequency, $v^2$ is a potential gradient, $\in$ is a dielectric constant, and $\tan \delta$ is a dielectric tangent.

The above expression shows that with an increase in the dielectric constant and the dielectric tangent, or with an increase in the frequency, the dielectric loss increases.

E glass, for example, has a dielectric constant of 6.7 and a dielectric tangent of $12 \times 10^{-4}$ at a frequency of 1 MHz at room temperature, and a printed wiring board formed of E glass is insufficient for complying with demands of a higher density and a higher processing speed. There are therefore desired glasses which have a lower dielectric constant and a lower dielectric tangent than the E glass. Among them is a glass called D glass. D glass is for example, a glass having a composition containing 75.3% of $SiO_2$, 20.5% of $B_2O_3$, 0.6% of CaO, 0.4% of MgO, 0.6% of $Li_2O$, 1.1% of $Na_2O$ and 1.5% of $K_2O$. For example, it has a dielectric constant of 4.3 and a dielectric tangent of $10 \times 10^{-4}$ at a frequency of 1 MHz at room temperature.

However, D glass has the following defects. Since it has poor meltability and is liable to cause striae and foams, a glass fiber frequently breaks during its spinning step, and it is poor in productivity and workability. Further, since it has a very high spinning temperature, the lifetime of a furnace is decreased. Moreover, there is another problem that since D glass has poor water resistance, and since it has poor adhesion to a resin, it is liable to peel from a resin in a printed wiring board so that no high reliability can be obtained when it is used for a printed wiring board.

JP-A-6-219780 discloses a low-dielectric-constant glass comprising 50.0 to 65.0% of $SiO_2$, 10.0 to 18.0% of $Al_2O_3$, 11.0 to 25.0% of $B_2O_3$, 6.0 to 14.0% of MgO, 1.0 to 10.0% of CaO and 0 to 10 of ZnO, MgO+CaO+ZnO being 10.5 to 15%. The above glass is intended to decrease a spinning temperature so as to improve productivity by particularly incorporating at least 6% of MgO and adjusting MgO+CaO+ZnO to at least 10.5%. Since, however, MgO, a component which is highly liable to undergo phase separation and give a high dielectric tangent, is incorporated in an amount of 6% or more, no sufficient water resistance can be obtained, and the dielectric tangent of the glass is relatively high.

JP-A-7-10598 discloses a glass having a composition containing 50.0 to 65.0% of $SiO_2$, 10.0 to 18% of $Al_2O_3$, 11.0 to 25.0% of $B_2O_3$, 0 to 10.0% of CaO, 0 to 10.0% of MgO, 1.0 to 15.0% of the CaO+the MgO, 0 to 10.0% of ZnO, 0 to 10.0% of SrO and 1 to 10.0% of BaO. Since, however, the above glass contains, as an essential component, BaO which is a component to increase the dielectric constant, it is difficult to obtain a sufficiently low dielectric constant. For obtaining a low dielectric constant, it is inevitable to decrease the BaO amount, and in this case, there is a problem that the viscosity of the glass increases so that the spinning workability is poor. Further, there is another problem that since BaO corrodes a furnace material to a great extent, the lifetime of the furnace is decreased.

The present Applicant has already proposed, by Japanese Patent Application No. 7-137688, a glass comprising 50 to 60% of $SiO_2$, 10 to 20% of $Al_2O_3$, 20 to 30% of $B_2O_3$, 0 to 5% of CaO, 0 to 4% of MgO, $Li_2O+Na_2O+K_2O$ being 0 to 0.5%, and 0.5 to 5% of $TiO_2$. The above glass retains a low dielectric constant and a low dielectric tangent and at the same time shows excellent properties during a spinning step with regard to workability and productivity. However, it still has some slight difficulty in workability and productivity.

DISCLOSURE OF THE INVENTION

The present invention has been made in view of the above circumstances, and an object of the present invention is to provide a glass which has properties of a low dielectric constant and a low dielectric tangent, which is excellent in productivity and workability and which is also excellent in water resistance.

The present inventors have made studies for achieving the above object, and as a result, it has been found that a glass fiber having a low dielectric constant and a low dielectric tangent can be obtained by allowing a composition for the glass fiber to particularly contain 60% or less of $SiO_2$, 0.5 to 5% of $TiO_2$ and 5%, exclusive of 5%, to 12% of CaO to improve the meltability of the glass and adjusting $Li_2O+Na_2O+K_2O$ to 1.0% or less.

The gist of the present invention is therefore a low-dielectric-constant glass fiber having a glass composition comprising, by % by weight, 45 to 60% of $SiO_2$, 8 to 20% of $Al_2O_3$, 15 to 30% of $B_2O_3$, 0 to 5% of MgO, 5 %, exclusive of 5%, to 12% of CaO, 0 to 1.0% of $Li_2O+Na_2O+K_2O$, 0.5 to 5% of $TiO_2$ and 0 to 2% of $F_2$.

BEST MODES FOR PRACTICING THE INVENTION

In the present invention, the reason for the limitation of the composition of the glass fiber is as follows.

$SiO_2$ is a component to form a glass network together with $Al_2O_3$ and $B_2O_3$. When the content of $SiO_2$ is less than 45%, not only the glass fiber has too large a dielectric constant, but it has low water resistance and low acid resistance, so that the glass fiber and a printed wiring board using it as a reinforcing material are deteriorated. When the above content exceeds 60%, the viscosity is too high, and it is sometimes difficult to form a fiber during spinning. The content of $SiO_2$ is therefore limited to 45 to 60%, and it is preferably 50 to 57%, more preferably 51 to 56%.

$Al_2O_3$ is liable to undergo phase separation when its content is less than 8%, and the glass is therefore downgraded in water resistance. When the content thereof exceeds 20%, the liquidus temperature of the glass increases to cause poor spinnability. The content of $Al_2O_3$ is therefore limited to 8 to 20%, and it is preferably 10 to 18%, more preferably 11 to 14%.

$B_2O_3$ is a component which is used as a flux to decrease a viscosity and ease melting. When the content thereof is less than 15%, however, the dielectric constant and the dielectric tangent of the fiber are too large. When it exceeds 30%, a volatilization amount during melting increases so that no homogeneous glass can be obtained, and further, the glass is too poor in water resistance. The content of $B_2O_3$ is therefore limited to 15 to 30%, and it is preferably 18 to 25%, more preferably 20 to 24%.

MgO is a component which is used as a flux to decrease a viscosity and ease melting. When the content of MgO exceeds 5%, however, phase separability is intensified so that the water resistance decreases, and further, the dielectric constant and the dielectric tangent are too large. The content of MgO is therefore limited to 0 to 5%, and it is preferably 0 to 4%.

Like MgO, CaO is a component which is used as a flux to decrease a viscosity and ease melting, and it is also a component which inhibits the conversion of $B_2O_3$ to $H_3BO_3$ so that it improves the glass in water resistance. The content of CaO is limited to over 5% and is limited to 12% or less. The reason for excluding its content of 5% or less is to avoid the overlapping of the above content with the content of CaO in the glass fiber described in JP-A-7-137688 which is a prior application filed by the present Applicant. The reason for limiting the upper limit thereof to 12% is that when the content thereof exceeds 12%, the dielectric constant and the dielectric tangent are too large. The content of CaO preferably exceeds 5% and is 10% or less, more preferably 6 to 9%.

The total content of MgO and CaO preferably exceeds 5% and is 12% or less. The reason why the above total content is preferably 12% or less is that when it exceeds 12%, the dielectric constant and the dielectric tangent are too large in some cases. The above total content more preferably exceeds 5% and is 10% or less.

$Li_2O$, $Na_2O$ and $K_2O$ are all used as a flux. When the total content of $Li_2O$, $Na_2O$ and $K_2O$ exceeds 1.0%, not only the dielectric constant is too high, but the water resistance is poor. The total content of $Li_2O+Na_2O+K_2O$ is therefore limited to 0 to 1.0%, and it is preferably 0 to 0.6%, more preferably 0.2 to 0.5%.

When the content of each of $Li_2O$ and $Na_2O$ exceeds 0.3%, or when the content of $K_2O$ exceeds 0.5%, the dielectric constant is too high in some cases. Therefore, preferably, the content of each of $Li_2O$ and $Na_2O$ is 0 to 0.3%, and the content of $K_2O$ is 0 to 0.5%. More referably, the content of $Li_2O$ is 0 to 0.2%, the content of $Na_2O$ is 0.1 to 0.2%, and the content of $K_2O$ is 0 to 0.2%.

$TiO_2$ is effective for decreasing the dielectric tangent and decreasing the viscosity, and further, it has a remarkably excellent effect on the inhibition of separation of a melt during initial melting, to decrease scum which occurs on a furnace surface. When the content thereof is less than 0.5%, these effects are small. When it exceeds 5%, it is liable to cause phase separation, which results in poor chemical durability. The content of $TiO_2$ is therefore limited to 0.5 to 5%, and it is preferably 1 to 4%, more preferably 1 to 3%.

In the glass composition of the present invention, $F_2$ not only works, as a flux, to decrease the viscosity of the glass, but also decreases the dielectric constant and, particularly, the dielectric tangent. When the content of $F_2$ exceeds 2%, the phase separability is intensified, and at the same, the heat resistance is poor in some cases. The content of $F_2$ is therefore limited to 0 to 2%. It is preferably 0.01 to 1.8%, more preferably 0.2 to 1.5%.

Besides the above component, the glass composition of the present invention may contain ZnO, SrO, $Fe_2O_3$, $Cr_2O_3$, $As_2O_3$, $Sb_2O_3$, $P_2O_5$, $ZrO_2$, $Cl_2$, $SO_3$, $MoO_2$, etc., up to 3% so long as the properties of the glass are not impaired.

As far as preferred physical properties of the low-dielectric-constant glass fiber of the present invention are concerned, the low-dielectric-constant glass fiber has a dielectric constant of 5 or less, a dielectric tangent of $10 \times 10^{-4}$ or less, a spinning temperature of 1,330° C. or lower and an alkali elution amount of 0.1% by eight or less.

The low-dielectric-constant glass fiber of the resent invention preferably has a glass composition comprising, by % by weight, 50 to 57% of $SiO_2$, 10 to 18 % of $Al_2O_3$, 18 to 25% of $B_2O_3$, 0 to 5% of MgO, 5%, exclusive of 5%, to 10% of CaO, 0 to 0.3% of $Li_2O$, 0 to 0.3% of $Na_2O$, 0 to 0.5% of $K_2O$, and 0.5 to 5% of $TiO_2$, the content of MgO+CaO exceeding 5% and being 12% or less, the content of $Li_2O+Na_2O+K_2O$ equaling 0 to 0.6%.

The glass fiber of the present invention is produced according to production techniques of known glasses such as E glass, C glass and D glass.

The glass fiber of the present invention has a low dielectric constant and a low dielectric tangent and is suitable as a glass fiber for a printed wiring board, particularly for reinforcing a printed wiring board for a high-density circuit. Further, since it has excellent properties with regard to productivity, water resistance and low thermal expansion properties, it can stably give a quality-stabilized glass fiber particularly for reinforcing a printed wiring board for a high-density circuit.

Particularly, a printed wiring board using a fabric of the glass fiber of the present invention has characteristics concerning drillability that positions of holes are not easily deviated and that the degree of wearing of a drill is low, and highly reliable printed wiring boards can be stably produced.

Further, substrates formed of the glass fiber of the present invention such as a fabric, a non-woven fabric, a textile, a chopped strand, a roving, a glass powder and a mat, and composite materials (e.g., a sheet molding compound, a bulk molding compound and a prepreg) formed of mixtures of these substrates with various thermosetting resins can be used as substrates for various resin reinforcements for communication machines and equipment and their peripheral members by utilizing the low dielectric constant and the low dielectric tangent thereof.

The low-dielectric-constant glass fiber of the present invention will be explained in detail on the basis of Examples.

EXAMPLES 1–6

A batch prepared to have a glass composition of a sample shown in Table 1 was placed in a platinum crucible and melted in an electric furnace with stirring under conditions of 1,500 to 1,550° C. and 8 hours. Then, the resultant molten glass was cast onto a carbon plate to obtain a glass cullet. The glass cullet was charged into a glass fiber production furnace and then melted at 1,300 to 1,400° C., and the molten glass was spun into a fiber to show that the voltatilization of a large amount of $B_2O_3$, which is caused in spinning of D glass, was not observed and that the fiber was spun without any trouble.

Separately, the glass cullet was melted in the form of a plate and gradually cooled and there was obtained a sample having a diameter of 45 mm and a thickness of 2 mm and both surfaces of which were optically polished. The sample was measured for a dielectric constant and a dielectric tangent at a frequency of 1 MHz at room temperature with a precision LCR meter (supplied by Hewlett-Packard) as a measuring device. Further, the sample was measured for a temperature (° C.) as a spinning temperature found when the glass had a viscosity η (poise) of $10^3$. Furthermore, for water resistance, the sample was measured for a weight (%) of an alkali component which was eluted from the glass fiber obtained by the spinning, according to the alkali elution test method provided by JIS R 3502. Table 1 shows these measurement results.

TABLE 1

|  | Comparative Example | | Example | | | | | |
| --- | --- | --- | --- | --- | --- | --- | --- | --- |
|  | D glass | E glass | 1 | 2 | 3 | 4 | 5 | 6 |
| $SiO_2$ | 75.3 | 54.7 | 51.5 | 53.5 | 54.2 | 55.2 | 55.7 | 52.4 |
| $Al_2O_3$ | 0.0 | 14.3 | 13.6 | 13.6 | 11.8 | 13.8 | 11.8 | 13.8 |
| $B_2O_3$ | 20.5 | 6.3 | 22.0 | 22.0 | 24.0 | 20.0 | 23.0 | 21.0 |
| MgO | 0.4 | 0.6 | 2.4 | 2.4 | 1.0 | 2.0 | 2.0 | 3.0 |
| CaO | 0.6 | 22.7 | 6.7 | 6.7 | 7.0 | 7.0 | 5.7 | 6.0 |
| MgO + CaO | 1.0 | 23.3 | 9.1 | 9.1 | 8.0 | 9.0 | 7.7 | 9.0 |
| $Li_2O$ | 0.6 | 0.0 | 0.15 | 0.15 | 0.15 | 0.10 | 0.15 | 0.10 |
| $Na_2O$ | 1.1 | 0.3 | 0.15 | 0.15 | 0.15 | 0.20 | 0.15 | 0.10 |
| $K_2O$ | 1.5 | 0.1 | 0.00 | 0.00 | 0.20 | 0.00 | 0.00 | 0.10 |
| $Li_2O + Na_2O + K_2O$ | 3.2 | 0.4 | 0.30 | 0.30 | 0.50 | 0.30 | 0.30 | 0.30 |
| $TiO_2$ | 0.0 | 0.2 | 3.0 | 1.0 | 1.0 | 1.0 | 1.0 | 3.0 |
| $F_2$ | 0.0 | 0.5 | 0.5 | 0.5 | 0.5 | 0.5 | 0.5 | 0.5 |
| Dielectric constant | 4.30 | 6.70 | 4.75 | 4.70 | 4.60 | 4.70 | 4.50 | 4.70 |
| Dielectric tangent ($\times 10^{-4}$) | 10.0 | 12.0 | 8.2 | 8.4 | 8.5 | 9.0 | 7.7 | 8.6 |
| Spinning temperature (° C.) | 1,410 | 1,200 | 1,250 | 1,292 | 1,320 | 1,315 | 1,347 | 1,270 |
| Alkali elution amount (wt %) | 0.30 | 0.01 | 0.04 | 0.05 | 0.04 | 0.04 | 0.02 | 0.03 |

As shown in Table 1, the glass fibers of Examples ad dielectric constants of less than 5.0 or less and ielectric tangents of $10 \times 10^{-4}$ or less, and all of these values are smaller than that of E glass and are smaller than, or almost equivalent to, that of D glass.

Further, as shown in Table 1, D glass showed an alkali elution amount of 0.30%, while all the glass fibers of Examples showed alkali elution amounts of less than 0.1% and are excellent in water resistance.

Furthermore, the glass fibers of Examples had spinning temperatures which were lower than that of D glass or were not higher than 1,350° C., said spinning temperature being a temperature at which a viscosity μ (poise) of a fiber is log μ=3.0 which is an index for spinning. And boric anhydride ($B_2O_3$) is not easily volatilzied, so that they have excellent productivity.

INDUSTRIAL UTILITY

The glass fiber of the present invention has a low dielectric constant and a low dielectric tangent and is excellent as a glass fiber for printed wiring boards, particularly for reinforcing printed wiring boards for high-density circuits. Further, it has excellent properties with regard to productivity, water resistance and low thermal expansion, so that the present invention can stably provide a quality-stabilized glass fiber particularly for reinforcing printed wiring boards for high-density circuits.

What is claimed is:

1. A low dielectric-constant glass fiber having a glass composition consisting essentially of, by % weight, 45 to 60% of $SiO_2$, 8 to 20% of $Al_2O_3$, 15 to 30% of $B_2O_3$, 0 to 5% of MgO, 5%, exclusive of 5%, to 12% of CaO, 0 to 1.0% of $Li_2O+Na_2O+K_2O$, 1.0 to 5% of $TiO_2$ and 0 to 2% of $F_2$, wherein said glass fiber has a dielectric tangent of no more than $9.0 \times 10^{-4}$.

2. The low-dielectric-constant glass fiber of claim 1, which has a glass composition consisting essentially of, by % by weight, 50 to 57% of $SiO_2$, 10 to 18% of $Al_2O_3$, 18 to 25% of $B_2O_3$, 0 to 5% of MgO, 5%, exclusive of 5%, to 10% of CaO, 0 to 0.3% of $Li_2O$, 0 to 0.3% of $Na_2O$, 0 to 0.5% of $K_2O$, 1.0 to 5% of $TiO_2$, and 0 to 2% of $F_2$, the content of MgO+CaO exceeding 5% and being 12% or less, the content of $Li_2O+Na_2O+K_2$ equaling 0 to 0.6%.

3. The low-dielectric-constant glass fiber of claim 1, which further contains at least one member selected from ZnO, SrO, $Fe_2O_3$, $Cr_2O_3$, $As_2O_3$, $Sb_2O_3$, $P_2O_5$, $ZrO_2$, $Cl_2$, $SO_3$, or $MoO_2$, in an amount of up to 3% provided the glass properties are not impaired.

4. The low-dielectric-constant glass fiber of claim 1, which has a dielectric constant of 5 or less and a spinning temperature of 1,347° C. or less and exhibits an alkali clution amount of less than 0.1% by weight.

5. The low-dielectric-constant glass fiber of claim 1, which is for use as a glass fiber for a printed wiring board.

* * * * *